(12) United States Patent
Setsompop et al.

(10) Patent No.: US 10,324,149 B2
(45) Date of Patent: Jun. 18, 2019

(54) SYSTEMS AND METHODS FOR GENERALIZED SLICE DITHERED ENHANCED RESOLUTION MAGNETIC RESONANCE IMAGING

(71) Applicant: THE GENERAL HOSPITAL CORPORATION, Boston, MA (US)

(72) Inventors: Kawin Setsompop, Cambridge, MA (US); Jason Stockmann, Cambridge, MA (US); Lawrence L Wald, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 429 days.

(21) Appl. No.: 15/285,719

(22) Filed: Oct. 5, 2016

(65) Prior Publication Data

US 2017/0102442 A1    Apr. 13, 2017

Related U.S. Application Data

(60) Provisional application No. 62/238,782, filed on Oct. 8, 2015.

(51) Int. Cl.
| | | |
|---|---|---|
| *G01V 3/00* | (2006.01) | |
| *G01R 33/483* | (2006.01) | |
| *G01R 33/561* | (2006.01) | |
| *G01R 33/56* | (2006.01) | |

(52) U.S. Cl.
CPC ..... *G01R 33/4835* (2013.01); *G01R 33/5608* (2013.01); *G01R 33/5611* (2013.01)

(58) Field of Classification Search
CPC .................................................. G01R 33/4835
USPC ................................................. 324/309, 307
See application file for complete search history.

(56) References Cited

U.S. PATENT DOCUMENTS

| | | | |
|---|---|---|---|
| 2017/0102442 A1* | 4/2017 | Setsompop | G01R 33/4835 |
| 2017/0293010 A1* | 10/2017 | Bhat | G01R 33/5611 |
| 2018/0100908 A1* | 4/2018 | Setsompop | G06T 11/00 |
| 2018/0106877 A1* | 4/2018 | Zeller | G01R 33/4835 |
| 2018/0267123 A1* | 9/2018 | Beck | G01R 33/5611 |

FOREIGN PATENT DOCUMENTS

WO    2016171759 A1    10/2016

OTHER PUBLICATIONS

Eichner, C. et al. "Real Diffusion-Weighted MRI Enabling True Signal Averaging and Increased Diffusion Contrast" Neuroimage. Nov. 15, 2015; 122: pp. 373-384.
Saritas, E.U. et al. "Hadamard Slice Encoding for Reduced-FOV DiffusionWeighted Imaging" Magnetic Resonance in Medicine (2014); 72: pp. 1277-1290.

* cited by examiner

*Primary Examiner* — Louis M Arana
(74) *Attorney, Agent, or Firm* — Quarles & Brady LLP

(57) ABSTRACT

Described here are systems and methods for using excited slice profiles to improve the point spread function ("PSF") of super-resolution slices in SLIDER acquisitions while preserving all of the advantages of the SLIDER technique. The techniques described here may generally be referred to as "Generalized SLIDER" ("g-SLIDER").

15 Claims, 5 Drawing Sheets

SYSTEMS AND METHODS FOR GENERALIZED SLICE DITHERED ENHANCED RESOLUTION MAGNETIC RESONANCE IMAGING

CROSS-REFERENCE TO RELATED APPLICATIONS

This application claims the benefit of U.S. Provisional Patent Application Ser. No. 62/238,782, filed on Oct. 8, 2015, and entitled "Systems and Methods for Generalized Slice Dithered Enhanced Resolution Magnetic Resonance Imaging."

STATEMENT REGARDING FEDERALLY SPONSORED RESEARCH

This invention was made with government support under MH106096 and EB019437 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for high-resolution MRI.

Slice dithered enhanced resolution simultaneous multislice ("SLIDER-SMS") MRI has recently been used in diffusion MRI scans to resolve sub-millimeter slices, as described in co-pending PCT Application Serial No. PCT/US15/53719. Acquiring sub-millimeter slices is impractical with conventional slice selection due to the low SNR and constraints on practical RF pulse duration. SLIDER-SMS overcomes these limitations by selecting a thick slab and introducing sub-voxel shifts along the slice direction between acquisitions. Thin slices are then obtained using a super-resolution technique during image reconstruction, providing slice images that are thinner than the originally excited slabs.

As compared with serial acquisition from individual thin slices, SLIDER provides higher SNR because the spins from a thick-slice are always contributing to the signal at any moment in time. The high signal level of each thick-slice acquisition is advantageous in diffusion imaging, where it permits accurate removal of background phase, thereby providing real-valued diffusion images (assuming minimal through-slice dephasing).

A drawback of the SLIDER approach, however, is that the shifted thick-slices do not form an orthonormal encoding basis. This causes noise amplification during the image reconstruction process that must be suppressed using regularization, which in turn blurs the slice profiles of the final high resolution slices. Therefore, a tradeoff exists between noise level and spatial resolution due to the linear dependence in the slice encoding functions.

SUMMARY OF THE INVENTION

The present invention overcomes the aforementioned drawbacks by providing a method for producing a plurality of images of a subject with a magnetic resonance imaging (MRI) system. A radio frequency (RF) excitation field that excites spins in a slab composed of a plurality of sub-slices that are each thinner than the slab, is applied to a subject. The RF excitation field is defined by a basis set in which a particular RF magnitude and RF phase are associated with each of the plurality of sub-slices. Data are acquired from the slab, and this process is repeated to acquire additional data while the basis set of the RF excitation field is adjusted during each repetition of the RF excitation. Slab images are reconstructed from the data and the additional data. High-resolution images are then produced from the slab images. The high-resolution images are associated with the sub-slices and have a higher through-plane resolution than the slab images.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Described here are systems and methods for using excited slice profiles to improve the point spread function ("PSF") of super-resolution slices in SLIDER acquisitions while preserving all of the advantages of the SLIDER technique. The techniques described here may generally be referred to as "Generalized SLIDER" ("g-SLIDER").

The g-SLIDER technique overcomes the drawbacks of SLIDER techniques described above by exploring the available degrees of freedom to additionally allow for variation of the amplitude profile, phase profile, or both, of the excited thick-slice in between acquisitions instead of just relying on a simple amplitude shifting of the entire thick-slice. Using appropriately designed RF pulses, the magnitude profile, phase profile, or both, can be set so as to make subsequent acquisitions less linearly dependent, thereby improving the condition number of the super-resolution image reconstruction problem.

One important constraint in the design of these basis sets is to design them such that a high SNR can be maintained in each individual thick-slice acquisition. This allows for the needed removal of background phase contamination in each thick-slice prior to super-resolution reconstruction. In cases where the SNR of each thick-slice is very high, the magnitude operation can be used as an simple way to remove phase, whereas in cases where the SNR is relatively lower (but not too low due to the way the thick-slice basis has been designed), the phase variation can be estimated using prior information about its smoothness, such as in the "real-diffusion" method described by C. Eichner, et al., in Real diffusion-weighted MRI enabling true signal averaging and increased diffusion contrast," *NeuroImage,* 2015; 122:373-384. One important consideration for the techniques described here, therefore, is to keep the SNR of the thick-slice acquisition high by designing the basis sets such that most of the spins in the sub-slices of the thick slice are contributing constructively to the overall signal of the thick slice. The end result of this is to create a basis set that is close to orthogonal while maintaining high SNR in each acquisition. This enable high quality super-resolution reconstruction with minimal noise and a sharper slice point spread function.

Figure 1:
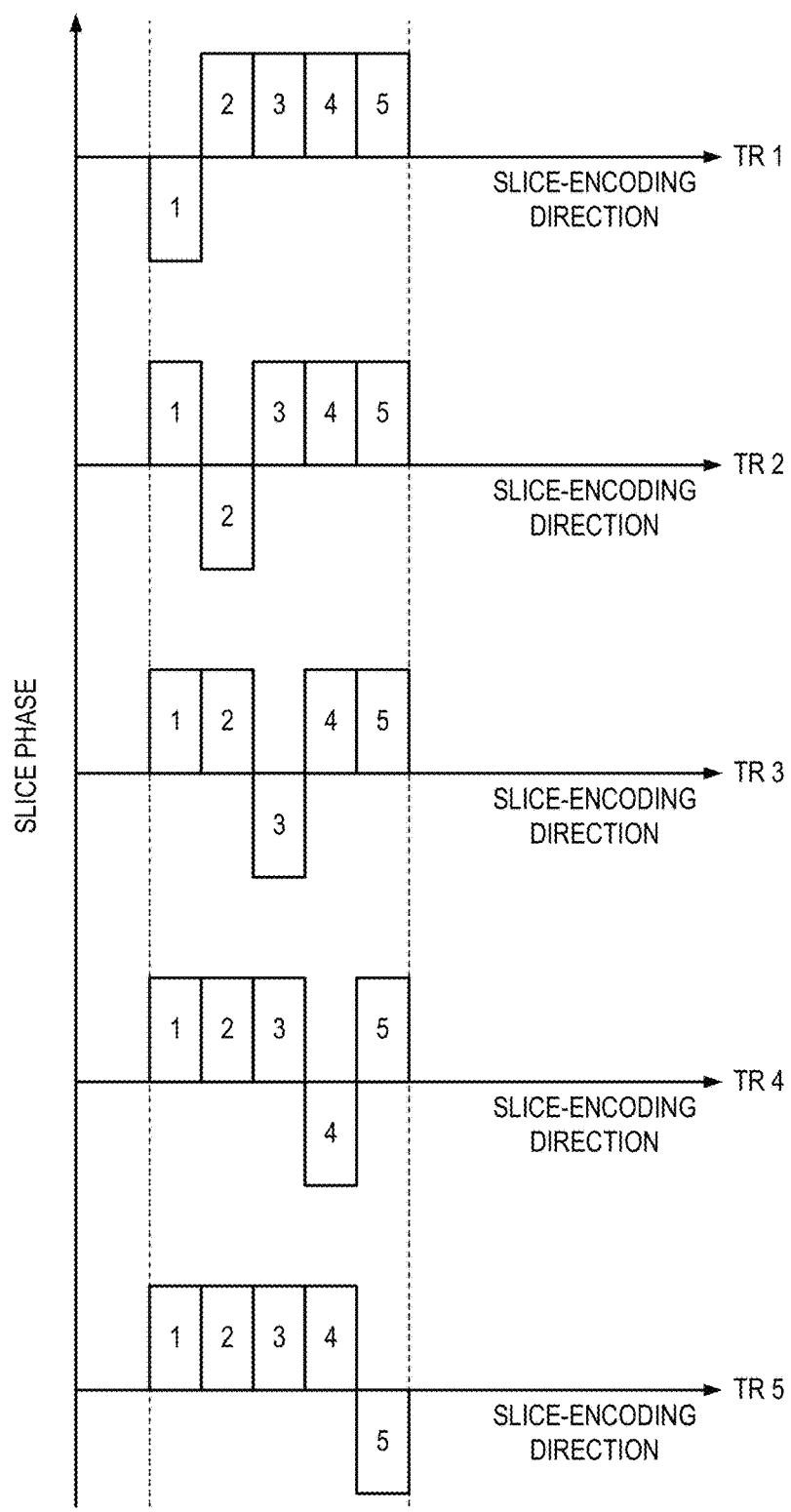
FIG. 1 is an example of a basis set for a radio frequency ("RF") excitation field that excites spins in a thick slab composed of multiple thinner sub-slices, and where a different phase is associated with one of the sub-slices (e.g., one sub-slice has a 180 degree phase and the others have zero degree phase) and the sub-slice with which the different phase is associated changes in each repetition time ("TR")

In one embodiment, illustrated in FIG. 1, a thick slice containing five sub-slice segments is excited with a pulse that imparts zero degree phase to four of the sub-slices and a 180 degree phase to the remaining, fifth sub-slice. In subsequent acquisitions (e.g., subsequent repetition time ("TR") periods), the location of the sub-slice with the 180 degree phase profile is shifted until all five configurations have been excited. In this example, all of the sub-slices are excited with pulses having the same magnitude; however, in some instances the magnitude of the pulses applied to the sub-slices could also be varied.

This approach is similar to Hadamard encoding, such as described by E. U. Saritas, in "Hadamard slice encoding for reduced-FOV diffusion-weighted imaging," *Magnetic Resonance in Medicine,* 2014; 72(5):1277-1290, with the crucial distinction that, unlike Hadamard encoding, g-SLIDER uses only one 180-degree phase shift per acquisition, thereby canceling signal from only one adjacent segment. With this distinction, full signal is retained from the remaining three segments, providing an approximately three-fold gain in SNR for purposes of background phase estimation as compared with individually acquiring a thin sub-slice.

This gain in SNR provides sufficient SNR to accurately remove background phase contamination from each diffusion image. By contrast, in Hadamard encoding the signal cancelation between sub-slices with zero degree and 180 degree phase profiles results in essentially no SNR gain relative to the intrinsic signal of a single sub-slice for some of the basis sets, as described below, which is inadequate for removing phase contamination for cases of high resolution imaging.

For the final reconstructed SLIDER image, the SNR is theoretically $\sqrt{N}$ times higher than the standard thin slice acquisition, where N is the number of thin slices excited in the larger thick slice volume. Using the improved slice profile orthogonality described above, this SNR gain can be approached without the need for regularization, which otherwise blurs the slice point spread function. Although the bases described above are not perfectly orthogonal, the small amount of linear dependence in the basis sets is a good tradeoff for improved SNR in each thick-slice acquisition to allow accurate phase removal.

This particular implementation of g-SLIDER has an added benefit over the original SLIDER slice shift approach, with less contamination from varying spin-history effects from one TR to the next. Here, the sub-slice with 180 degree phase is shifted between acquisitions rather than shifting the whole slab. With this approach, there is less opportunity for the spin history to vary due to spatially shifting the slice position from one TR to the next, which can contaminate the acquired signal, particularly for short TRs.

Figure 2A:
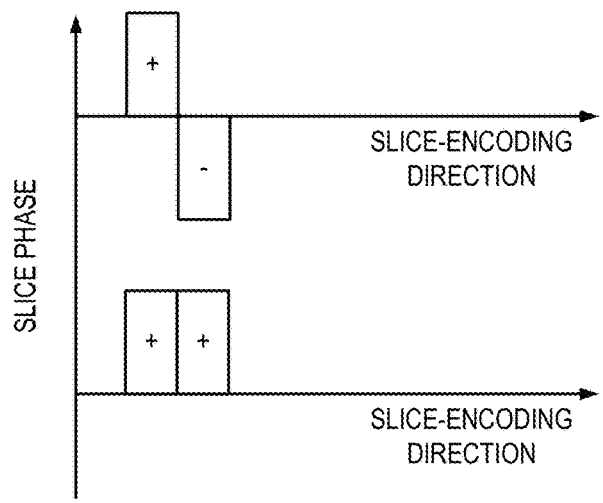
FIG. 2A is an example of Hadamard encoding with an even number of sub-slices.
Figure 2B:
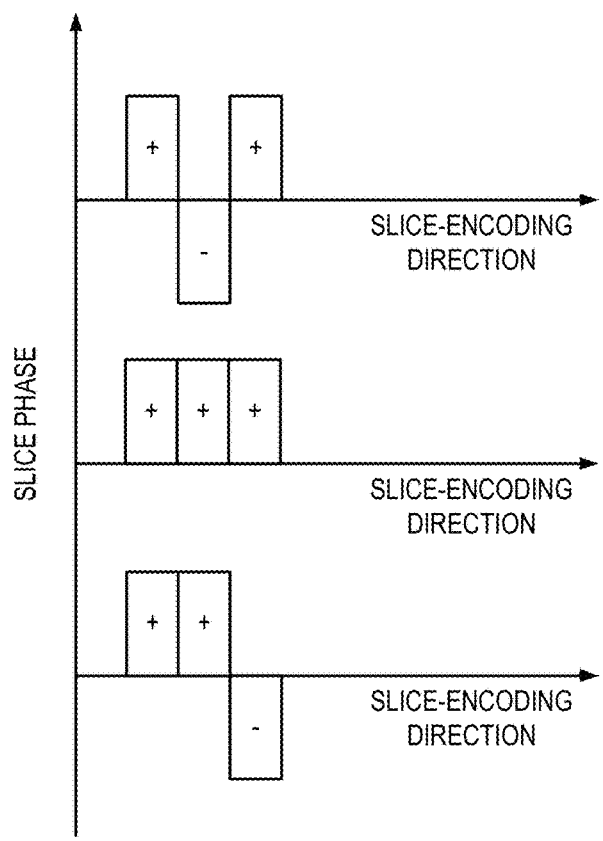
FIG. 2B is an example of Hadamard encoding with an odd number of sub-slices.

There are some instances where standard Hadamand encoding can achieve the desired criteria for basis set design in generalized-SLIDER. Specifically, the criteria can be achieved for odd numbers of sub-slice encoding, where the level of signal from each individual sub-slice would provide sufficient SNR for phase contamination estimation and removal. In these instances, there could be sufficient SNR to perform phase estimation and reliably use the estimated phase to correct for phase issues prior to super-resolution reconstruction. As a result, it can be possible to implement diffusion-weighted imaging without the need to acquire navigator data. For even numbers of sub-slice encoding, however, the Hadamand basis set will always result in at least one of the thick-slice acquisitions having SNR close to zero due to the deconstructive combination of signals from the sub-slices. This is illustrated in FIGS. 2A and 2B.

Figure 3:
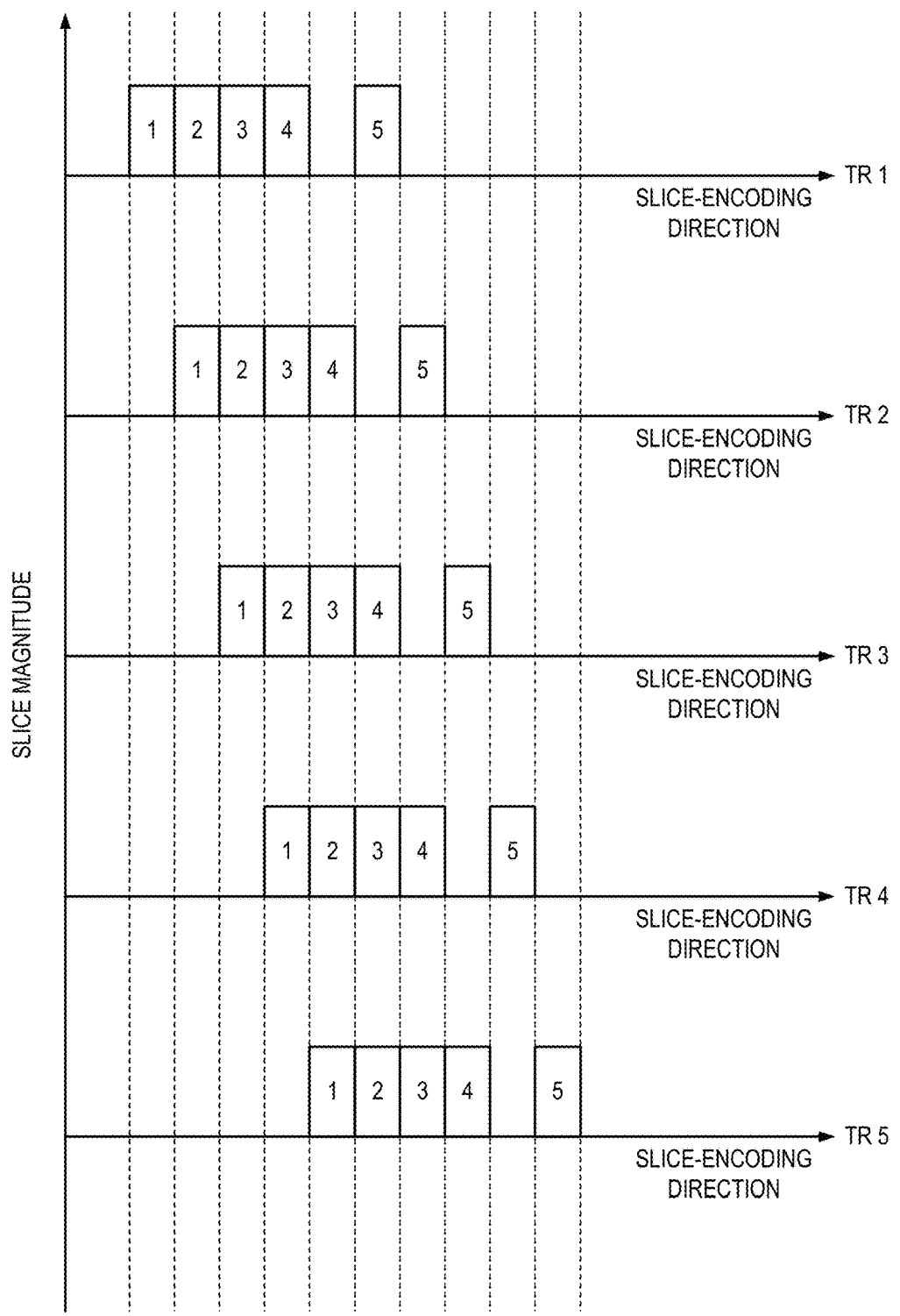
FIG. 3 is an example of a basis set for an RF excitation field that excites spins in a thick slab composed of multiple thinner sub-slices in which one sub-slice is separated from the others by a gap, and where the locations of the sub-slices are shifted in each TR.

In another embodiment of generalized-SLIDER, illustrated in FIG. 3, the magnitude basis of the excitation is chosen such that there is a gap in the excitation of the sub-slices. As one example, for five sub-slice SLIDER, one basis would be to have four adjacent slices excited with a gap one sub-slice thick and then another slice excited next to this gap, as shown in FIG. 3. The other basis sets in this embodiment would be the slice-shifted version of this first basis set (e.g., where the second basis set would retain the shape of the first basis set, but be shifted in the z-direction by one sub-slice distance). In this example, the same phase is associated with each sub-slice; however, in some other instances the phase associated with one or more of the sub-slices could also be varied. For instance, the phase associated with sub-slice 5 could be 180 degrees while the phase associated with sub-slices 1-4 could be zero degrees.

It is contemplated that this would be a good basis set to use in cases where the signal level is low because all of the sub-slices' signal add constructively in each thick-slice acquisition to provide an approximately five-fold gain in SNR relative to that of a single sub-slice (assuming minimal phase variation across slices). This particular basis contains a sharp profile transition that decrease the basis dependence of the original SLIDER slice-shifting method, while maintaining high SNR of thick slice acquisition. As such, it should also improve the super-resolution reconstruction trade-offs between SNR benefit and blurring.

Figure 4:
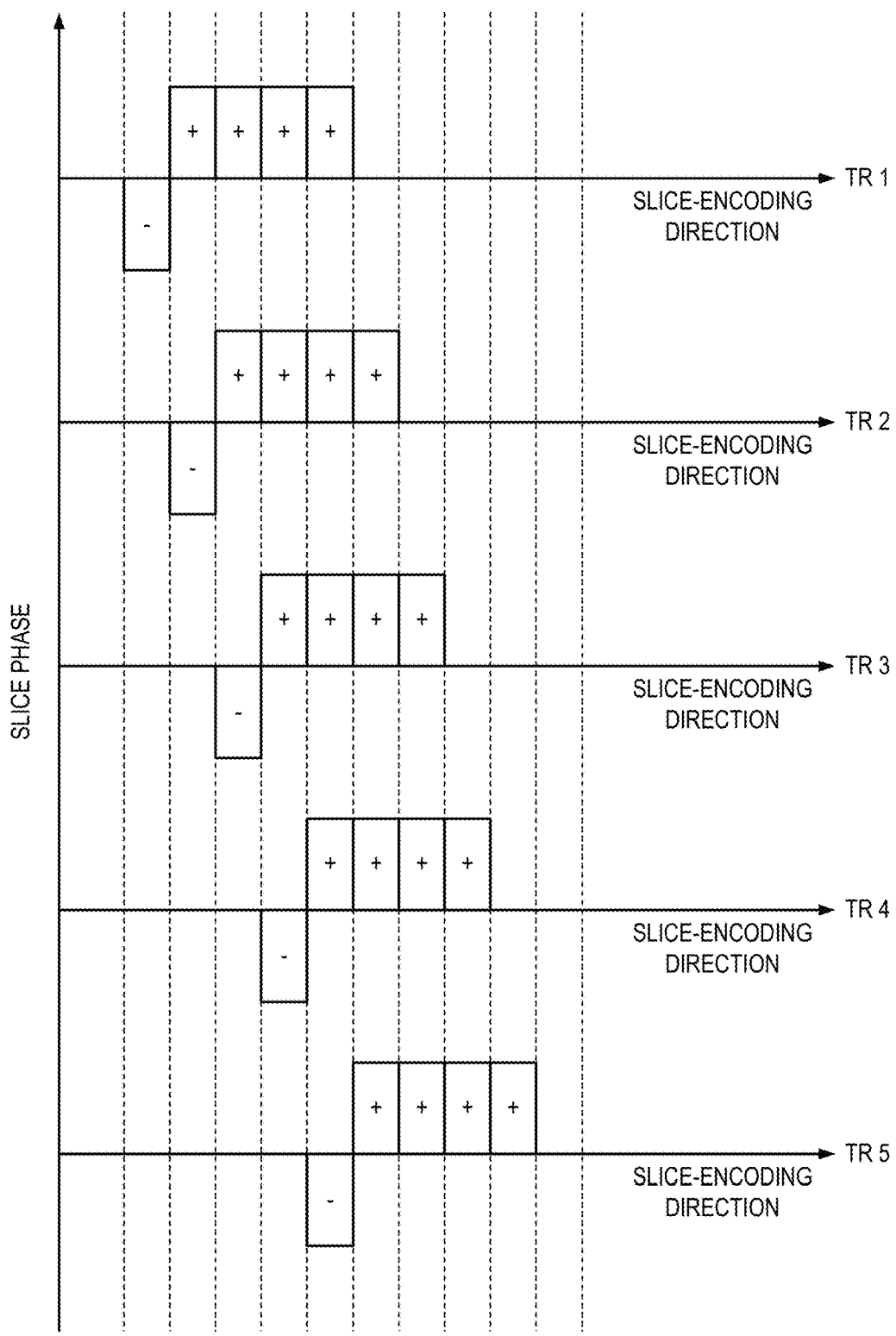
FIG. 4 is an example of a basis set for an RF excitation field that excites spins in a thick slab composed of multiple thinner sub-slices, and where a different phase is associated with one of the sub-slices and the locations of the sub-slices are shifted in each TR.

In another embodiment of generalized-SLIDER, illustrated in FIG. 4, slice shifting is combined with phase modulation within the thick-slice direction. As one example, a thick-slice containing five sub-slices is excited with a phase of $\{\pi, 0, 0, 0, 0\}$ for the sub-slices, respectively. To create the different basis sets, the thick-slice excitation is then incrementally shifted in the slice-encoding direction (e.g., incrementally shifted by the thickness of one sub-slice).

In general, generalized-SLIDER provides the ability to perform thick-slice encoding (i.e., slab-encoding) without the need for additional time-consuming and potentially high specific absorption rate ("SAR") navigator scans to correct for phase contamination, particularly in diffusion images. This is achieved by designing the basis of the thick-slice encoding so that each acquisition contains sufficient SNR to allow for phase contamination estimation and removal (with an assumption that there is only a small or minimal through slice dephasing). This reduces the scan time and avoids the extra RF power deposition associated with the refocusing pulses in the navigator scans. It is also straightforward to incorporate the parallel receive array simultaneous multi-slice ("SMS") feature in order to acquire multiple thick-slices at the same time, using methods such as blipped-CAIPIRINHA to allow simultaneously acquired slabs to be untangled in an efficient manner with low SNR loss. The SLIDER technique is also compatible with compressed sensing approaches for Q-space imaging.

The generalized-SLIDER technique provides a sharp slice point spread function while retaining around ninety percent of maximum achievable SNR gain with no or minimal regularization.

Figure 5:
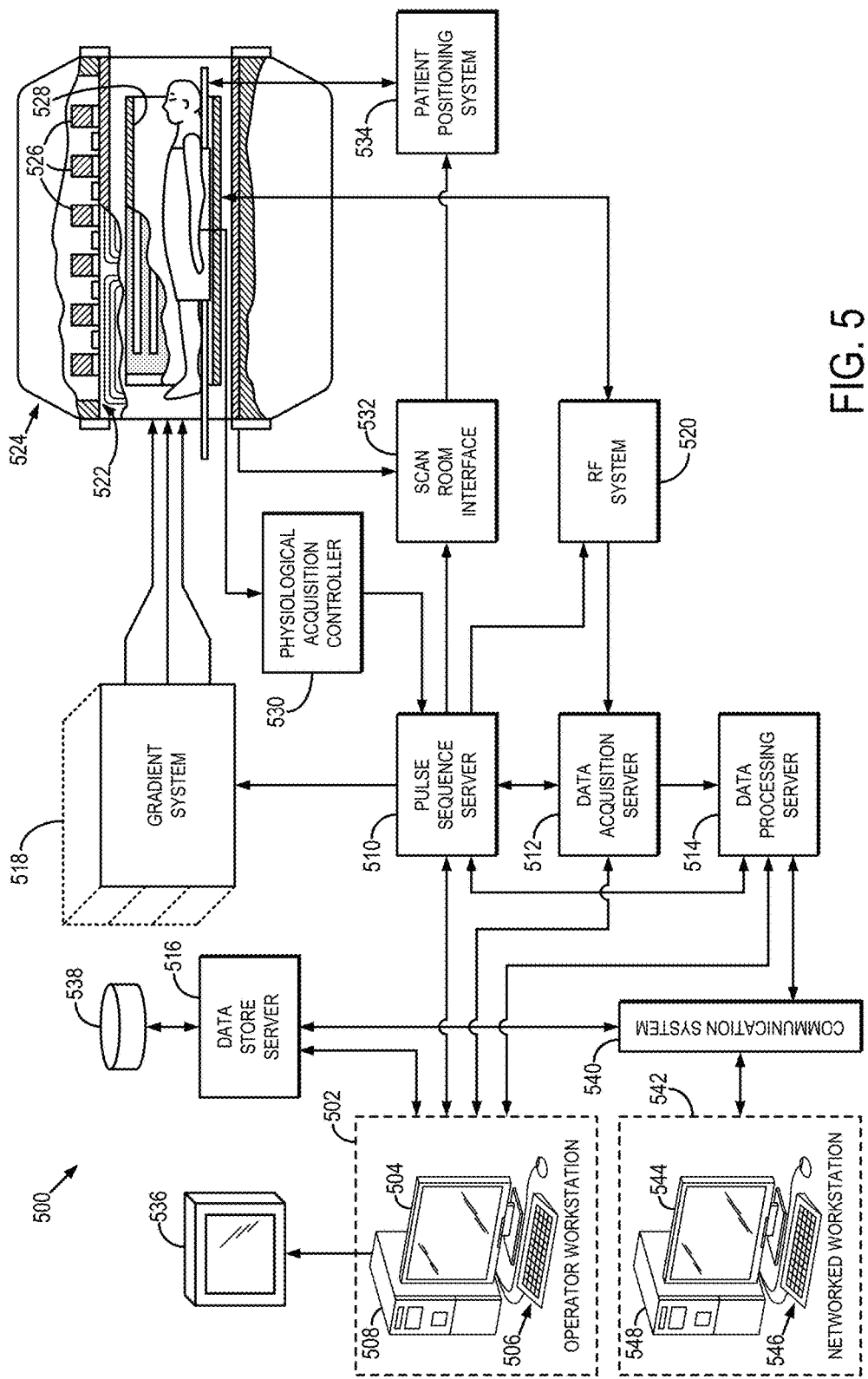
FIG. 5 is a block diagram of an example of a magnetic resonance imaging ("MRI") system.

Referring particularly now to FIG. 5, an example of a magnetic resonance imaging ("MRI") system 500 is illustrated. The MRI system 500 includes an operator workstation 502, which will typically include a display 504; one or more input devices 506, such as a keyboard and mouse; and a processor 508. The processor 508 may include a commercially available programmable machine running a commercially available operating system. The operator workstation 502 provides the operator interface that enables scan prescriptions to be entered into the MRI system 500. In general, the operator workstation 502 may be coupled to four servers: a pulse sequence server 510; a data acquisition server 512; a data processing server 514; and a data store server 516. The operator workstation 502 and each server 510, 512, 514, and 516 are connected to communicate with each other. For example, the servers 510, 512, 514, and 516 may be connected via a communication system 540, which may include any suitable network connection, whether wired, wireless, or a combination of both. As an example, the communication system 540 may include both proprietary or dedicated networks, as well as open networks, such as the internet.

The pulse sequence server 510 functions in response to instructions downloaded from the operator workstation 502 to operate a gradient system 518 and a radiofrequency ("RF") system 520. Gradient waveforms necessary to perform the prescribed scan are produced and applied to the gradient system 518, which excites gradient coils in an assembly 522 to produce the magnetic field gradients $G_x$, $G_y$, and $G_z$ used for position encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 528, or a separate local coil (not shown in FIG. 5), in order to perform the prescribed magnetic resonance pulse sequence. Responsive magnetic resonance signals detected by the RF coil 528, or a separate local coil (not shown in FIG. 5), are received by the RF system 520, where they are amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the scan prescription and direction from the pulse sequence server 510 to produce RF pulses of the desired frequency, phase, and pulse amplitude waveform. The generated RF pulses may be applied to the whole-body RF coil 528 or to one or more local coils or coil arrays (not shown in FIG. 5).

The RF system 520 also includes one or more RF receiver channels. Each RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \quad (1);$$

and the phase of the received magnetic resonance signal may also be determined according to the following relationship:

$$\varphi = \tan^{-1}\left(\frac{Q}{I}\right). \quad (2)$$

The pulse sequence server 510 also optionally receives patient data from a physiological acquisition controller 530. By way of example, the physiological acquisition controller 530 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 510 to synchronize, or "gate," the performance of the scan with the subject's heart beat or respiration.

The pulse sequence server 510 also connects to a scan room interface circuit 532 that receives signals from various sensors associated with the condition of the patient and the magnet system. It is also through the scan room interface circuit 532 that a patient positioning system 534 receives commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, such that no data is lost by data overrun. In some scans, the data acquisition server 512 does little more than pass the acquired magnetic resonance data to the data processor server 514. However, in scans that require information derived from acquired magnetic resonance data to control the further performance of the scan, the data acquisition server 512 is programmed to produce such information and convey it to the pulse sequence server 510. For example, during prescans, magnetic resonance data is acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also be employed to process magnetic resonance signals used to detect the arrival of a contrast agent in a magnetic resonance angiography ("MRA") scan. By way of example, the data acquisition server 512 acquires magnetic resonance data and processes it in real-time to produce information that is used to control the scan.

The data processing server 514 receives magnetic resonance data from the data acquisition server 512 and processes it in accordance with instructions downloaded from the operator workstation 502. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 514 are conveyed back to the operator workstation 502 where they are stored. Real-time images are stored in a data base memory cache (not shown in FIG. 5), from which they may be output to operator display 502 or a display 536 that is located near the magnet assembly 524 for use by attending physicians. Batch mode images or selected real time images are stored in a host database on disc storage 538. When such images have been reconstructed and transferred to storage, the data processing server 514 notifies the data store server 516 on the operator workstation 502. The operator workstation 502 may be used by an operator to archive the images, produce films, or send the images via a network to other facilities.

The MRI system 500 may also include one or more networked workstations 542. By way of example, a networked workstation 542 may include a display 544; one or more input devices 546, such as a keyboard and mouse; and a processor 548. The networked workstation 542 may be located within the same facility as the operator workstation 502, or in a different facility, such as a different healthcare institution or clinic.

The networked workstation 542, whether within the same facility or in a different facility as the operator workstation 502, may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing a plurality of images of a subject with a magnetic resonance imaging (MRI) system, the steps of the method comprising:
    (a) applying, with the MRI system, a radio frequency (RF) excitation field that excites spins in a slab composed of a plurality of sub-slices that are each thinner than the slab, wherein the RF excitation field is defined by a basis set in which a particular RF magnitude and RF phase are associated with each of the plurality of sub-slices;
    (b) acquiring, with the MRI system, data from the slab;
    (c) repeating steps (a) and (b) to acquire additional data, wherein the basis set of the RF excitation field is adjusted during each repetition of step (a);
    (d) reconstructing slab images from the data and the additional data; and
    (d) producing high-resolution images from the slab images, wherein the high-resolution images are associated with the sub-slices and have a higher through-plane resolution than the slab images.

2. The method as recited in claim 1, wherein adjusting the basis set in step (c) includes adjusting the RF phase associated with at least one of the sub-slices.

3. The method as recited in claim 2, wherein the basis set includes a different RF phase being associated with one of the sub-slices.

4. The method as recited in claim 3, wherein adjusting the basis set in step (c) includes changing the sub-slice with which the different RF phase is associated.

5. The method as recited in claim 1, wherein at least one of the sub-slices is not spatially adjacent to the other sub-slices.

6. The method as recited in claim 5, wherein the plurality of sub-slices each have a same thickness and the plurality of sub-slices includes at least one sub-slice separated from at least one other sub-slice by a distance equal to the thickness of the sub-slices.

7. The method as recited in claim 5, wherein adjusting the basis set in step (c) includes shifting the plurality of sub-slices along a slice-encoding direction.

8. The method as recited in claim 1, wherein the basis set includes a different RF phase being associated with at least one of the sub-slices, and wherein adjusting the basis set in step (c) includes shifting the plurality of sub-slices along a slice-encoding direction.

9. The method as recited in claim 1, wherein the RF excitation field applied in step (a) is applied to a plurality of slabs each associated with a different basis set, and step (b) includes simultaneously acquiring data from each of the plurality of slabs.

10. The method as recited in claim 9, wherein step (d) includes reconstructing a slab image for each of the plurality of slabs using a simultaneous multislice (SMS) reconstruction technique.

11. The method as recited in claim 10, wherein step (a) includes acquiring the data using an array of RF receive coils.

12. The method as recited in claim 11, further comprising obtaining a coil sensitivity profile for each RF receive coil in the array of RF receive coils, and wherein step (d) includes reconstructing the slab images based in part on the coil sensitivity profile for each RF receive coil.

13. The method as recited in claim 12, wherein the SMS reconstruction technique used in step (d) is at least one of slice-GRAPPA or SENSE.

14. The method as recited in claim 1, wherein step (g) includes producing the high-resolution images based on a linear combination of the first images and the second images.

15. The method as recited in claim 1, wherein steps (c) and (d) are repeated to acquire additional data from a different plurality of shifted slice locations that are shifted relative to the plurality of slice locations by a different shift value, and further comprising reconstructing additional images from the additional data and producing the high-resolution images from the first images, the second images, and the additional images.

* * * * *